(12) United States Patent
Choi

(10) Patent No.: US 9,716,099 B2
(45) Date of Patent: Jul. 25, 2017

(54) SEMICONDUCTOR DEVICE AND MANUFACTURING METHOD THEREOF

(71) Applicant: SK hynix Inc., Icheon-si, Gyeonggi-do (KR)

(72) Inventor: Kang Sik Choi, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 14 days.

(21) Appl. No.: 15/149,373

(22) Filed: May 9, 2016

(65) Prior Publication Data

US 2017/0162591 A1 Jun. 8, 2017

(30) Foreign Application Priority Data

Dec. 3, 2015 (KR) ........................ 10-2015-0171545

(51) Int. Cl.
| | | |
|---|---|---|
| *H01L 27/115* | (2017.01) | |
| *H01L 27/11556* | (2017.01) | |
| *H01L 27/11582* | (2017.01) | |
| *H01L 29/08* | (2006.01) | |
| *H01L 21/311* | (2006.01) | |

(52) U.S. Cl.
CPC .. *H01L 27/11556* (2013.01); *H01L 21/31144* (2013.01); *H01L 27/11582* (2013.01); *H01L 29/0847* (2013.01)

(58) Field of Classification Search
None
See application file for complete search history.

(56) References Cited

U.S. PATENT DOCUMENTS

| | | | | |
|---|---|---|---|---|
| 2013/0095622 | A1* | 4/2013 | Jee | H01L 29/7889 438/264 |
| 2014/0291751 | A1* | 10/2014 | Lee | H01L 29/792 257/324 |
| 2016/0071926 | A1* | 3/2016 | Kitazaki | H01L 29/0649 257/314 |

FOREIGN PATENT DOCUMENTS

| | | | |
|---|---|---|---|
| KR | 1020130038032 A | | 4/2013 |
| KR | 1020160020210 A | | 2/2016 |

* cited by examiner

*Primary Examiner* — Angel Roman
*Assistant Examiner* — Kevin Quinto
(74) *Attorney, Agent, or Firm* — William Park & Associates Ltd.

(57) ABSTRACT

A semiconductor device includes a first source seed layer, a second source seed layer disposed over the first source seed layer while being spaced apart from the first source seed layer, a stacked structure formed on the second source seed layer, channel layers extending inside the first source seed layer by penetrating the stacked structure, and an interlayer source layer extending into a space between the first source seed layer and the second source seed layer while contacting each of the channel layers, the first source seed layer, and the second source seed layer.

15 Claims, 17 Drawing Sheets

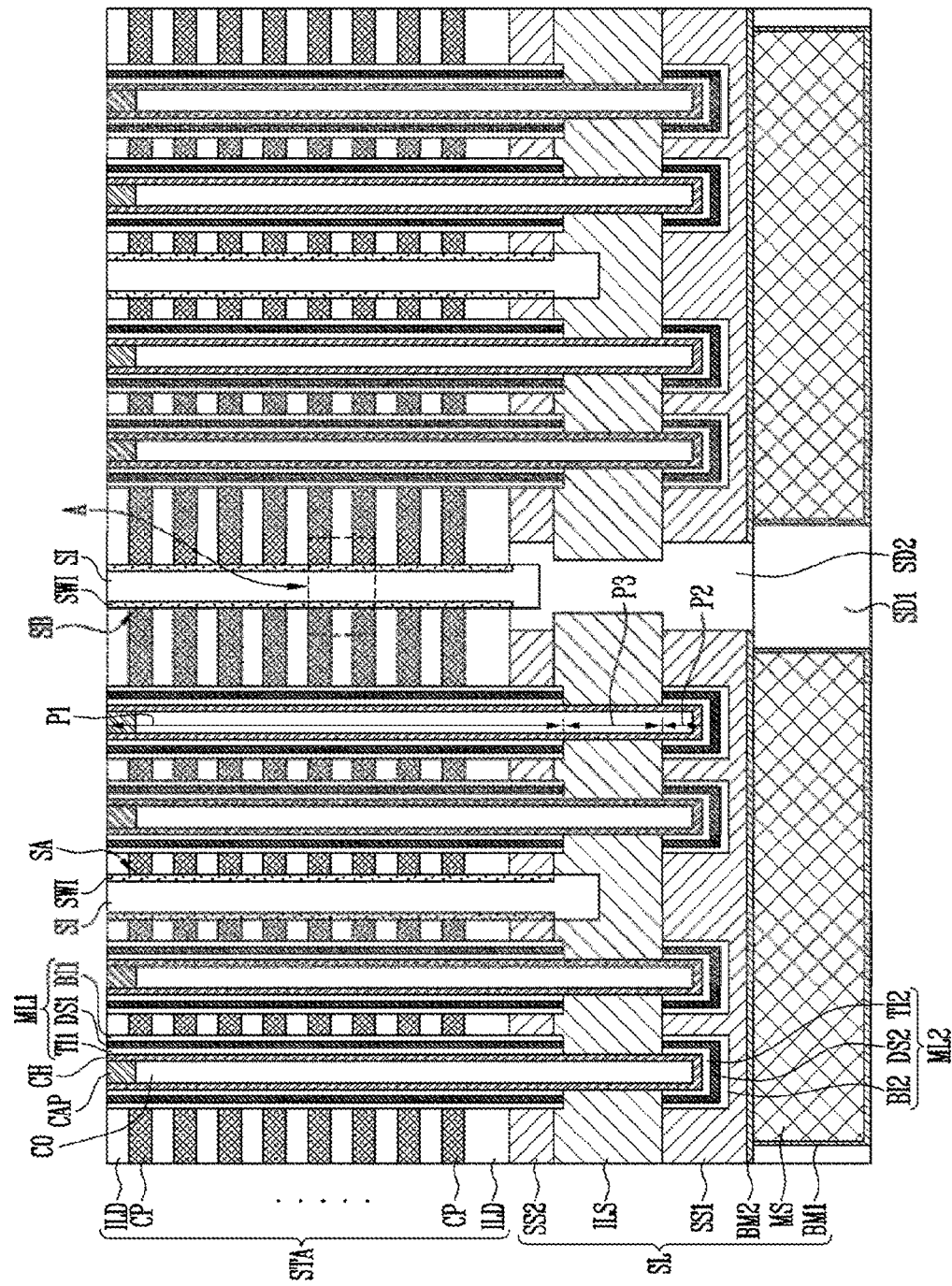

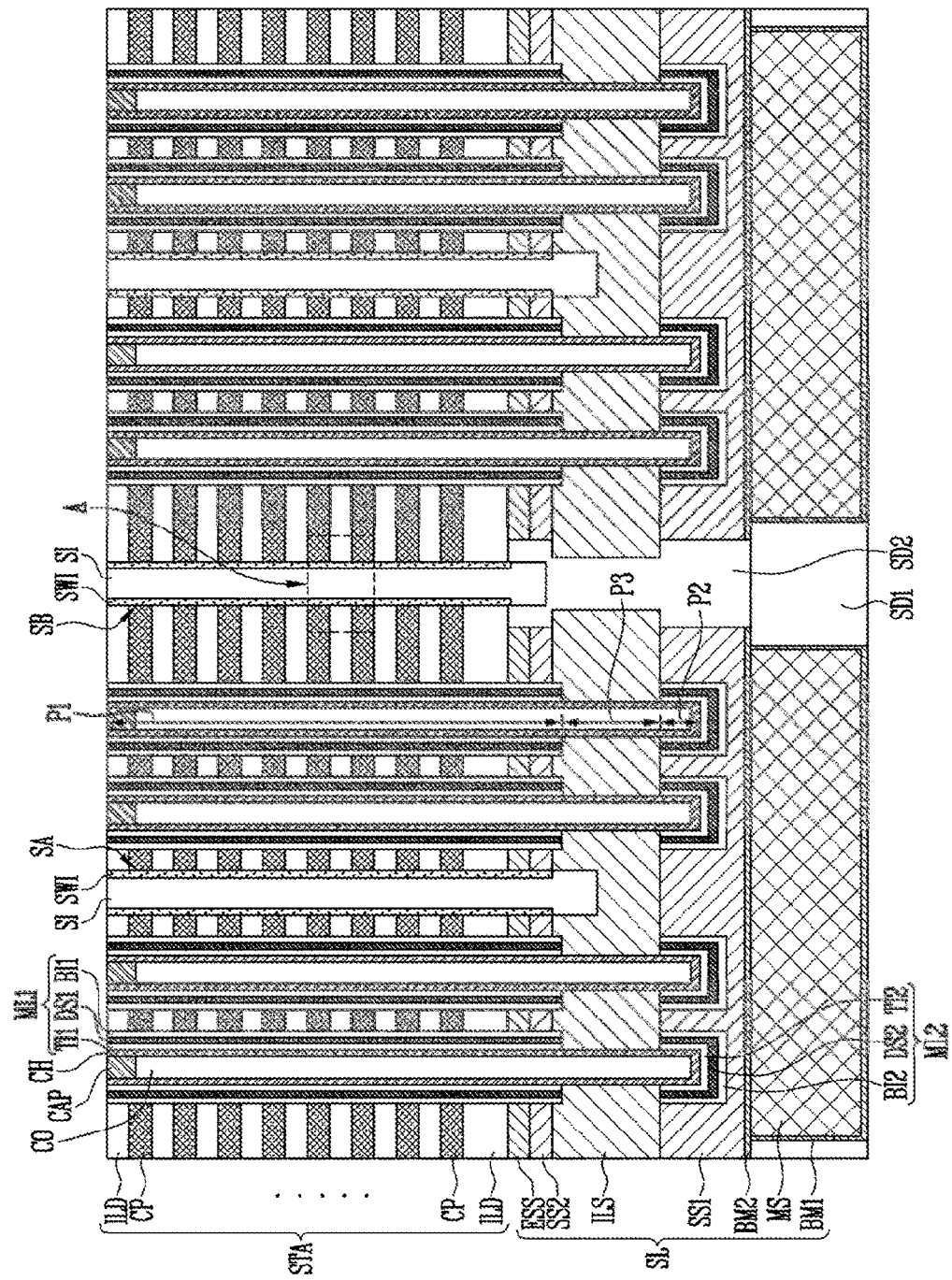

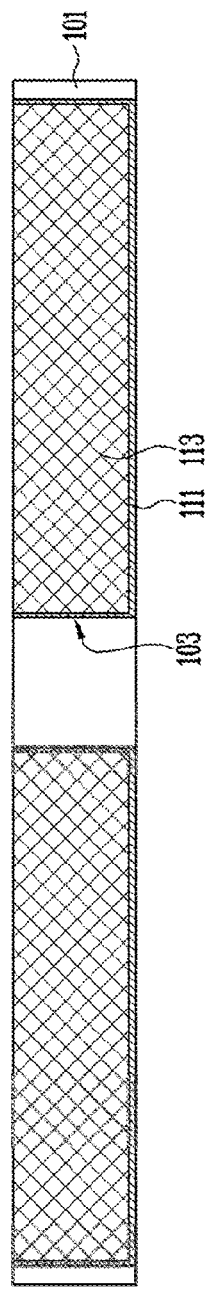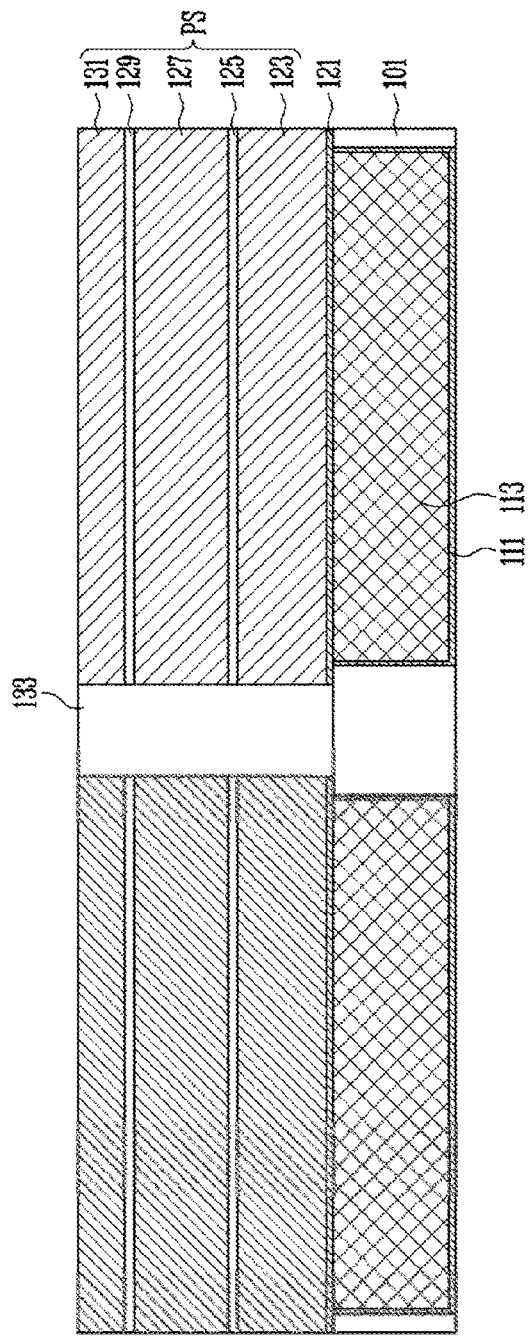

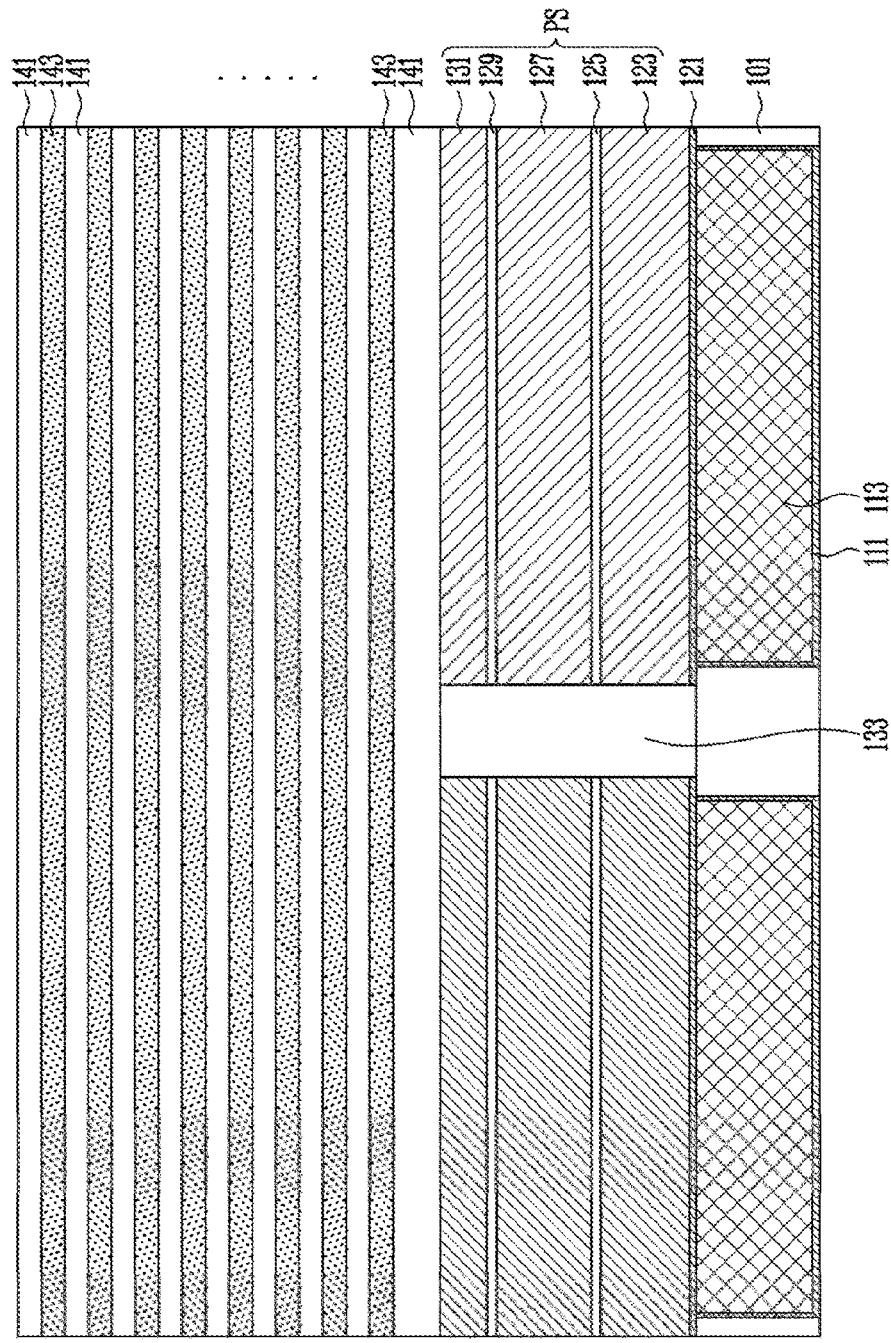

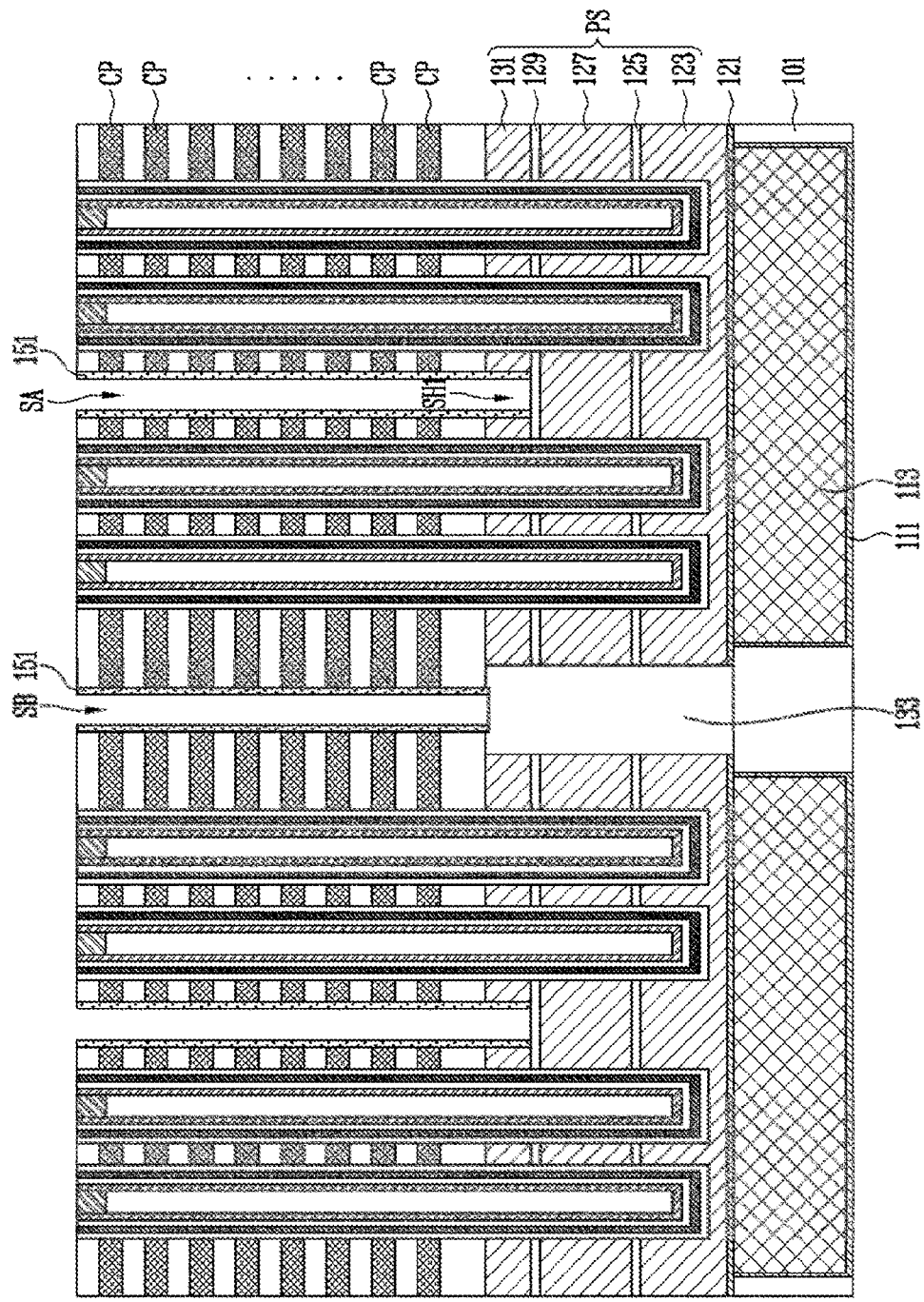

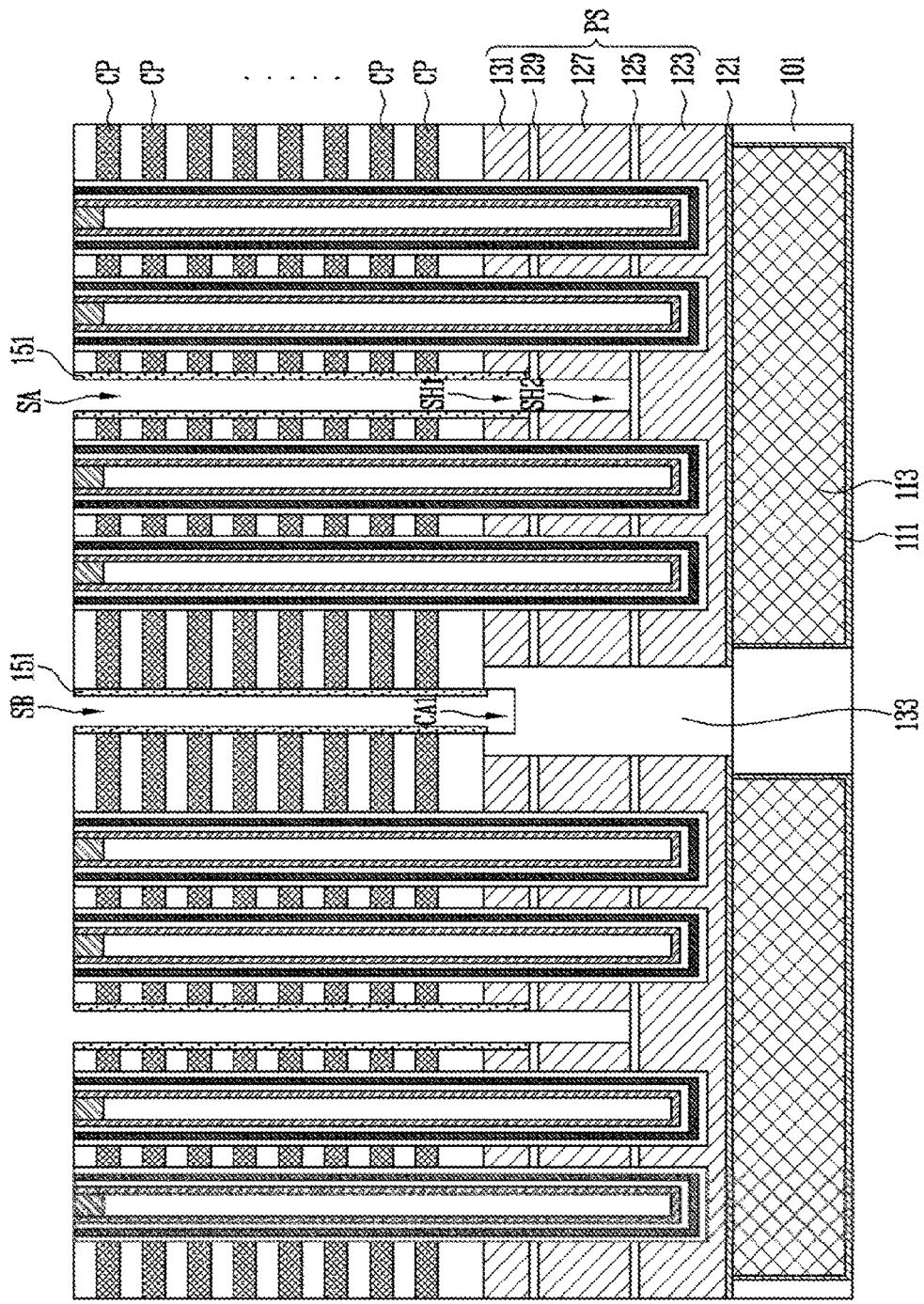

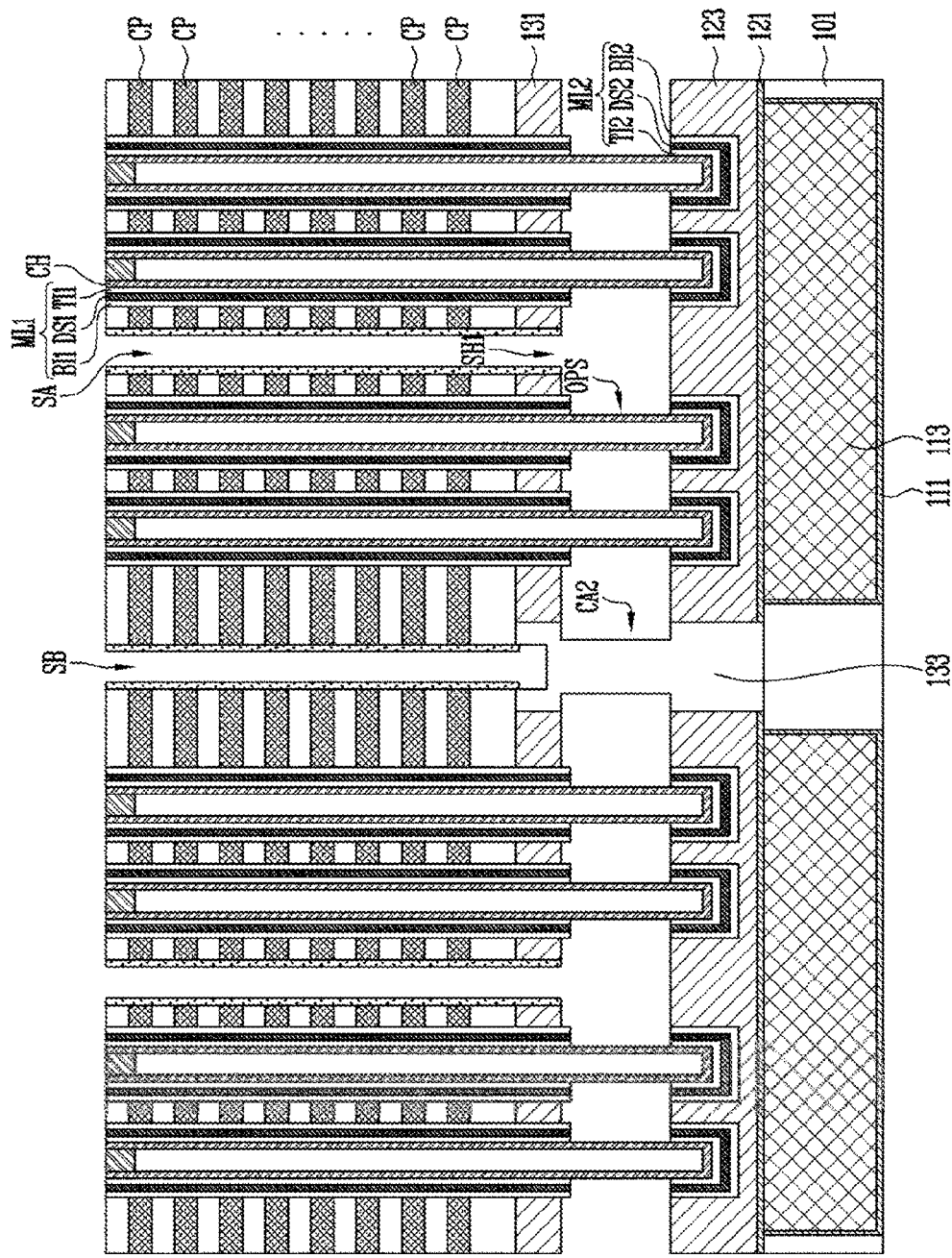

SEMICONDUCTOR DEVICE AND MANUFACTURING METHOD THEREOF

CROSS-REFERENCE TO RELATED APPLICATION

The present application claims priority under 35 U.S.C. §119(a) to Korean patent application number 10-2015-0171545 filed on Dec. 3, 2015 in the Korean Intellectual Property Office, the entire disclosure of which is incorporated herein by reference.

BACKGROUND

1. Technical Field

An aspect of the present disclosure relates to a semiconductor device and a manufacturing method thereof, and more particularly, to a three-dimensional semiconductor memory device and a manufacturing method thereof.

2. Related Art

A semiconductor device may include a plurality of memory cells capable of storing data. To achieve a high degree of integration, a three-dimensional semiconductor memory device including three-dimensionally arranged memory cells has been proposed.

The memory cells of the three-dimensional semiconductor memory device may be stacked over each other. The memory cells may be connected in series through a channel layer to form a memory string. The channel layer may be connected to a bit line and a source layer.

As the number of stacked memory cells increases, the degree of difficulty of connecting the channel layer and the source layer increases. In addition, it is difficult to stably secure electrical characteristics of the memory cell.

SUMMARY

According to an aspect of the present disclosure, there is provided a semiconductor device including a first source seed layer; a second source seed layer disposed over the first source seed layer while being spaced apart from the first source seed layer, a stacked structure formed on the second source seed layer, channel layers extending inside the first source seed layer by penetrating the stacked structure. Further, an interlayer source layer extending into a space between the first source seed layer and the second source seed layer while contacting the channel layers, the first source seed layer, and the second source seed layer.

According to an aspect of the present disclosure, there is provided a method of manufacturing a semiconductor device, the method including forming a preliminary source stacked structure including a first source seed layer, a sacrificial layer, and a second source seed layer, which are sequentially stacked. The method also includes alternately stacking first material layers and second material layers on the second source seed layer, forming channel layers extending inside the first source seed layer by penetrating the first material layers and the second material layers, the channel layers each being surrounded by a multi-layered layer. Still further, the method includes forming a slit penetrating the first material layers and the second material layers between the channel layers, forming a source through-hole exposing the sacrificial layer by penetrating the second source seed layer exposed through the slit, removing the sacrificial layer and the multi-layered layer through the source-through hole, thereby forming a source area separating the multi-layered layer into first and second multi-layered patterns, the source area exposing the channel layer between the first source seed layer and the second source seed layer. The method also includes growing an interlayer source layer from the channel layer exposed through the source area, the first source seed layer, and the second source seed layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, the element may be the only element between the two elements, or one or more intervening elements may also be present. Like reference numerals refer to like elements throughout.

FIGS. 1A and 1B are sectional views illustrating semiconductor devices according to embodiments of the present disclosure.

FIGS. 3A to 3M are sectional views illustrating a manufacturing method of a semiconductor device according to an embodiment of the present disclosure.

DETAILED DESCRIPTION

Figure 2:
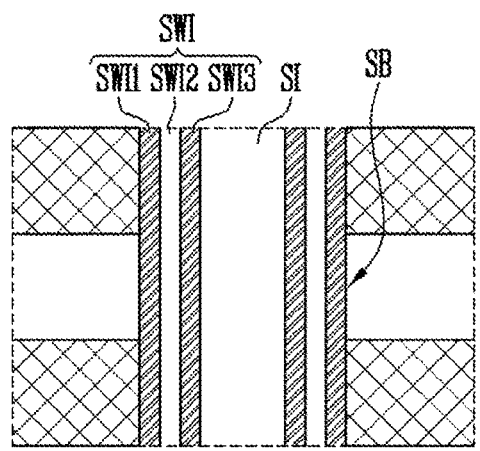
FIG. 2 is a sectional view illustrating a sidewall insulating layer of a multi-layered structure according to an embodiment of the present disclosure.

Example embodiments of the present disclosure will be described with reference to the accompanying drawings. The example embodiments of the present disclosure may, however, be embodied in many different forms and should not be construed as limited to the example embodiments set forth herein. Rather, the example embodiments are provided so that the present disclosure will be thorough and complete, and will fully convey a scope of the present disclosure to those skilled in the art. The features of example embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

Embodiments provide a semiconductor device and a manufacturing method thereof, which may decrease the degree of difficulty of a manufacturing process and stably secure electrical characteristics of a source layer.

FIGS. 1A and 1B are sectional views illustrating semiconductor devices according to embodiments of the present disclosure.

Referring to FIGS. 1A and 1B, each of the semiconductor devices according to the embodiments of the present disclosure includes a multi-layered source layer SL, a stacked structure STA, channel layers CH, a slit insulating layer SI, and a sidewall insulating layer SWI. Although not shown in these figures, drive transistors constituting a circuit for driving a memory string of each of the semiconductor devices may be disposed under the multi-layered source layer SL of the semiconductor device. Some of the drive transistors and the multi-layered source layer SL may be electrically connected to each other through a routing line or contact plug disposed therebetween.

As shown in FIG. 1A, the multi-layered source layer SL may include a first source seed layer SS1, an interlayer source layer ILS, and a second source seed layer SS2. Alternatively, as shown in FIG. 1B, the multi-layered source layer SL may include a first source seed layer SS1, an interlayer source layer ILS, a second source seed layer SS2, and an etch stop source layer ESS.

Referring to FIGS. 1A and 1B, the second source seed layer SS2 is disposed above the first source seed layer SS1 while being spaced apart from the first source seed layer SS1. The interlayer source layer ILS is disposed in a space between the first source seed layer SS1 and the second source seed layer SS2.

The first source seed layer SS1 and the second source seed layer SS2 may be formed of a material capable of serving as a growth seed of the interlayer source layer ILS. The first source seed layer SS1 and the second source seed layer SS2 may be formed of the same material as each other. For example, the first source seed layer SS1 and the second source seed layer SS2 may include silicon. Also, the first source seed layer SS1 and the second source seed layer SS2 may be formed of a material capable of supplying a dopant to the interlayer source layer ILS. For example, the first source seed layer SS1 and the second source seed layer SS2 may include an n-type or p-type dopant.

The interlayer source layer ILS is a material layer grown from the first source seed layer SS1 and the second source seed layer SS2, and may include silicon. The interlayer source layer ILS may include a dopant supplied from the first source seed layer SS1 and the second source seed layer SS2. For example, the interlayer source layer ILS may include an n-type or p-type dopant. The interlayer source layer ILS may contact the channel layer CH, which will be described later, to supply the dopant to the channel layer CH.

The second source seed layer SS2 is formed of polysilicon having an etching selection ratio substantially similar to an oxide, and therefore, may serve as an etch stop layer when forming slits SA and SB which will be described later. The second source seed layer SS2, serving as the etch stop layer, may be formed with a first thickness as shown in FIG. 1A. Alternatively, the second source seed layer SS2 may be formed with a second thickness that is thinner than the first thickness as shown in FIG. 1B.

The etch stop source layer ESS shown in FIG. 1B may be formed of a conductive material having a higher etching selection ratio with respect to an oxide than the second source seed layer SS2. For example, the etch stop source layer ESS may be formed of carbon doped polysilicon. Accordingly, the etch stop source layer ESS may supplement a function of the second source seed layer SS2, which is formed with the second thickness, as the etch stop layer. As the second source seed layer SS2 becomes thinner, a distance between the interlayer source layer ILS and the lowermost conductive pattern among conductive patterns CP of the stacked structure STA, which will be described later, decreases. As a result, a dopant supplied from the interlayer source layer ILS easily reaches up to a height at which the lowermost conductive pattern is disposed. Accordingly, it is possible to easily form an overlap area between the lowermost conductive pattern and a junction of an area to which the dopant is supplied within the channel layer CH.

Referring to FIGS. 1A and 1B, the multi-layered source layer SL may further include a metal source layer MS disposed under the first source seed layer SS1. The metal source layer MS may be formed of a material having a lower resistance than the first source seed layer SS1, the second source seed layer SS2, and the interlayer source layer ILS. For example, the metal source layer MS may include tungsten.

The metal source layer MS may be penetrated by a first source dielectric layer SD1 to separate the metal source layer MS into a plurality of patterns. The first source seed layer SS1 and the second source seed layer SS2 may be penetrated by a second source dielectric layer SD2 to separate the first source seed layer SS1 and the second source seed layer SS2 into a plurality of patterns. The second source dielectric layer SD2 may be disposed on the first source dielectric layer SD1. The interlayer source layer ILS protrudes further into a sidewall of the second source dielectric layer SD2 than each of the first source seed layer SS1 and the second source seed layer SS2.

A first barrier metal layer BM1 may be formed along a space between a sidewall of the first source dielectric layer SD1 and a sidewall of the metal source layer MS and a bottom surface of the metal source layer MS. That is, the first barrier metal layer BM1 may surround the sidewall and bottom surface of the metal source layer MS. A second barrier metal layer BM2 may be formed between the first source seed layer SS1 and the metal source layer MS. The second barrier metal layer BM2 may be penetrated by the second source dielectric layer SD2.

The stacked structure STA is disposed over the multi-layered source layer SL and the second source dielectric layer SD2, and the stacked structure STA may be formed on the second source seed layer SS2. The stacked structure STA includes interlayer dielectric layers ILD and conductive patterns CP, which are alternately stacked. The conductive patterns CP may be used as gate electrodes of select transistors and memory cells. The interlayer dielectric layers ILD may be used to insulate the conductive patterns CP from each other. The conductive patterns CP may include at least one of polysilicon, metal, and metal silicide. The interlayer dielectric layers ILD may include an oxide.

The stacked structure STA may be penetrated by the slits SA and SB. The slits SA and SB may include a first slit SA and a second slit SB. The first slit SA may be disposed to overlap the multi-layered source layer SL. The first slit SA may be formed to penetrate the second source seed layer SS2 and the etch stop source layer ESS in the multi-layered source layer SL. The second slit SB may be disposed to overlap the second source dielectric layer SD2. The sidewall insulating layer SWI and the slit insulating layer SI may be formed inside each of the slits SA and SB. The sidewall insulating layer SWI may be formed on a sidewall of each of the slits SA and SB, and the slit insulating layer SI may be formed to fill in each of the slits SA and SB. The slit insulating layer SI may be formed on the sidewall insulating layer SWI, and the slit insulating layer SI may be formed deeper than the sidewall insulating layer SWI. For example, the slit insulating layer SI filling in the first slit SA may extend to an upper portion of the interlayer source layer ILS, and the slit insulating layer SI filling in the second slit SB may extend inside of the second source dielectric layer SD2.

The sidewall insulating layer SWI is formed to protect the interlayer dielectric layers ILD, the conductive patterns CP, and the second source seed layer SS2 from an etching process, and may be formed of a different material than the interlayer dielectric layers ILD, the conductive patterns CP, and the second source seed layer SS2. The sidewall insulating layer SWI may be formed of a single layer or multiple layers. When the sidewall insulating layer SWI is formed of a single layer, the sidewall insulating layer SWI may be formed of a nitride layer. When the sidewall insulating layer SWI is formed of multiple layers, the sidewall insulating layer SWI may be formed into a different structure than each of first and second multi-layered patterns ML1 and ML2 which will be described later. The sidewall insulating layer SWI of a multi-layered structure will be described later with reference to FIG. 2.

Each of the channel layers CH extends inside the first source seed layer SS1 by penetrating the stacked structure STA. Each of the channel layer CH may be formed in a tubular shape surrounding a core insulating layer CO. In this case, the height of the core insulating layer CO may be formed lower than that of the channel layers CH. A capping layer CAP may be further formed on the core insulating layer CO. The capping layer CAP may be surrounded by an upper end of any one of the channel layers CH corresponding thereto. The channel layers CH and the capping layer CAP may be formed of a semiconductor material. The capping layer CAP may include a dopant having a higher concentration than the channel layers CH. Although not shown in these figures, the capping layer CAP and the core insulating layer CO is not be formed in some embodiments. In this case, each of the channel layers CH may be formed as an embedded channel layer filling in a space occupied by the capping layer CAP and the core insulating layer CO. Each of channel layers CH may be used as a channel of the memory string. The first slit SA may be disposed between the channel layers CH adjacent to each other.

Each of the channel layers CH may be divided into first to third portions P1 to P3. The first portion P1 penetrates the stacked structure STA and the second source seed layer SS2. The second portion P2 penetrates an upper portion of the first source seed layer SS1. The third portion P3 is disposed between the first and second portions P1 and P2. The third portion P3 of each of the channel layers CH contacts the interlayer source layer ILS. The interlayer source layer ILS may be grown from the third portion P3 of each of the channel layers CH.

As described above, the interlayer source layer ILS is a layer grown from the third portion P3 of each of the channel layers CH, the first source seed layer SS1, and the second source seed layer SS2. Accordingly, the interlayer source layer ILS may contact the third portion P3 of each of the channel layers CH, the first source seed layer SS1, and the second source seed layer SS2, to extend, with a uniform thickness, toward the space between the first source seed layer SS1 and the second source seed layer SS2. The interlayer source layer ILS may be grown upward from the first source seed layer SS1, grown downward from the second source seed layer SS2, and grown sideways from the second source seed layer SS2. If the growth direction of the interlayer source layer ILS varies as described above, the interlayer source layer ILS is easily formed with a substantial thickness without any void. Particularly, in embodiments of the present disclosure, the interlayer source layer ILS is grown from the first and second source seed layers SS1 and SS2 respectively disposed at lower and upper portions thereof. Accordingly, in embodiments of the present disclosure, although the growth thickness of the interlayer source layer ILS may be reduced in half, the interlayer source layer ILS having a desired thickness may be provided compared to when the interlayer source layer ILS is grown in any one of the upper or lower directions.

An outer wall of the first portion P1 of each of the channel layers CH may be surrounded by the first multi-layered pattern ML1. The first multi-layered pattern ML1 may surround the outer wall of the first portion P1 and may include a first tunnel insulating pattern TI1, a first data storage pattern DS1 surrounding the first tunnel insulating pattern TI1, and a first blocking insulating pattern BI1 surrounding the first data storage pattern DS1. An outer wall of the second portion P2 of each of the channel layers CH may be surrounded by the second multi-layered pattern ML2. The second multi-layered pattern ML2 may surround the outer wall of the second portion P2 and may include a second tunnel insulating pattern TI2, a second data storage pattern DS2 surrounding the second tunnel insulating pattern TI2, and a second blocking insulating pattern BI2 surrounding the second data storage pattern DS2.

The first and second multi-layered patterns ML1 and ML2 may be separated by the interlayer source layer ILS. The first and second tunnel insulating patterns TI1 and TI2 are portions of a tunnel insulating layer surrounding the outer wall of each of the channel layers CH and separated by the interlayer source layer ILS. The first and second data storage patterns DS1 and DS2 are portions of a data storage layer surrounding the tunnel insulating layer and separated by the interlayer source layer ILS. The first and second blocking insulating patterns BI1 and BI2 are portions of a blocking insulating layer surrounding the data storage layer and separated by the interlayer source layer ILS. The data storage layer may include silicon, nitride, phase change material, nano-dot, etc. The blocking insulating layer may include an oxide layer capable of blocking electric charges.

According to embodiments of the present disclosure, the select transistor is formed at an intersection portion of the channel layer CH and a select line among the conductive patterns CP, and the memory cell is formed at an intersection portion of the channel layer CH and a word line among the conductive patterns CP. The uppermost and lowermost conductive patterns among the conductive patterns CP may be used as upper and lower select lines, respectively. The patterns disposed between the uppermost and lowermost conductive patterns among the gate conductive patterns CP may be used as word lines. According to the structure described above, an upper select transistor connected to an upper select line, a lower select transistor connected to a lower select line, and memory cells connected to word lines may be connected in series by each of the channel layers CH. The memory string includes an upper select transistor, memory cells, and a lower select transistor, which are connected in series.

FIG. 2 is a sectional view illustrating a sidewall insulating layer of a multi-layered structure according to an embodiment of the present disclosure. Particularly, FIG. 2 is a sectional view obtained by enlarging area A shown in FIGS. 1A and 1B.

Referring to FIG. 2, the sidewall insulating layer SWI may be formed of multiple layers surrounding a slit insulating layer SI inside a slit (e.g., SB). More specifically, the sidewall insulating layer SWI may include first to third sidewall insulating layers SWI1 to SWI3.

The third sidewall insulating layer SWI3 may surround the slit insulating layer SI. The second sidewall insulating layer SWI2 may surround the third sidewall insulating layer SWI3. The first sidewall insulating layer SWI1 may surround the second sidewall insulating layer SWI2.

The first sidewall insulating layer SWI1, disposed at the outermost side of the sidewall insulating layer SWI, may be formed of a different material than the blocking insulating layer described in FIGS. 1A and 1B. For example, the first sidewall insulating layer SWI1 may be formed of a nitride layer.

The third sidewall insulating layer SWI3, disposed at the innermost side of the sidewall insulating layer SWI, may be formed of a different material than the tunnel insulating layer described in FIGS. 1A and 1B. For example, the third sidewall insulating layer SWI3 may be formed of a nitride layer.

The second sidewall insulating layer SWI2, disposed between the first and third sidewall insulating layers SWI1 and SWI3, may be formed of a different material than the data storage layer described in FIGS. 1A and 1B. For example, the second sidewall insulating layer SWI2 may be formed of an oxide layer.

The multi-layered sidewall insulating layer SWI including the above-described materials may serve as a protective layer while a process of etching the blocking insulating layer, the data storage layer, and the tunnel insulating layer to expose the channel layer is performed.

FIGS. 3A to 3M are sectional views illustrating a method of manufacturing a semiconductor device according to an embodiment of the present disclosure. More specifically, FIGS. 3A to 3M are sectional views illustrating a method of manufacturing the semiconductor device shown in FIG. 1A.

Referring to FIG. 3A, a metal source layer 113 may be formed over a substrate (not shown) including a lower structure. Although not shown in this figure, the lower structure may include drive transistors constituting a circuit for driving a memory string of the semiconductor device, a routing line, and contact plugs, connected to the drive transistors.

The metal source layer 113 may be formed of a metal having a lower resistance than first and second source seed layers to be formed in a subsequent process. For example, the metal source layer 113 may include tungsten.

The metal source layer 113 may be formed using a damascene process. For example, a first source dielectric layer 101 is formed over the substrate including the lower structure. Subsequently, trenches 103 are formed by etching the first source dielectric layer 101. After that, the inside of each of the trenches 103 is filled with the metal source layer 113. A first barrier metal layer 111 may be further formed before the metal source layer 113 is formed. The first barrier metal layer 111 may be formed on a surface of each of the trenches 103. The metal source layer 113 is disposed on the first barrier metal layer 111, and completely fills in each of the trenches 103. After the first barrier metal layer 111 and the metal source layer 113 are formed, the metal source layer 113 and the first barrier metal layer 111 may be planarized until the first source dielectric layer 101 is exposed.

Referring to FIG. 3B, a preliminary source stacked structure PS may be formed on the first source dielectric layer 101 including the metal source layer 113. Before the preliminary source stacked structure PS is formed, a second barrier metal layer 121 may be formed on the first source dielectric layer 101 including the metal source layer 113 so as to prevent metal diffusion from the metal source layer 113.

The preliminary source stacked structure PS may be formed by sequentially stacking a first source seed layer 123, a sacrificial layer 127, and a second source seed layer 131.

The first source seed layer 123 and the second source seed layer 131 may be used as growth seed layers of an interlayer source layer in a subsequent process. The first source seed layer 123 and the second source seed layer 131 may be formed of the same material as each other. The first source seed layer 123 and the second source seed layer 131 may be formed of a material capable of supplying a dopant to the interlayer source layer in a subsequent process. The sacrificial layer 127 may be formed of a material capable of being selectively removed in a subsequent process. More specifically, the sacrificial layer 127 may be formed of a material having a different etching selection ratio than the first source seed layer 123 and the second source seed layer 131. The first source seed layer 123 and the second source seed layer 131 may serve as growth seed layers of an interlayer source layer. The first source seed layer 123 and the second source seed layer 131 may be formed of a doped silicon layer capable of supplying a dopant to the interlayer source layer. The doped silicon layer may include an n-type or p-type dopant. The dopant may be added through an implantation process after each of the first source seed layer 123 and the second source seed layer 131 is deposited. The sacrificial layer 127 may be formed of an undoped polysilicon layer.

The preliminary source stacked structure PS may further include a first protective layer 125 and a second protective layer 129. In order for the sacrificial layer 127 to be interposed between the first protective layer 125 and the second protective layer 129, the first protective layer 125 is deposited before the sacrificial layer 127 is formed, and the second protective layer 129 is deposited after the sacrificial layer 127 is formed. The first protective layer 125 is disposed between the sacrificial layer 127 and the first source seed layer 123, and the second protective layer 129 is disposed between the sacrificial layer 127 and the second source seed layer 131. The first and second protective layers 125 and 129 may be formed of a material having a different etching selection ratio than the first source seed layer 123, the sacrificial layer 127, and the second source seed layer 131. For example, the first and second protective layers 125 and 129 may be formed of an oxide layer.

After the preliminary source stacked structure PS is formed, a second source dielectric layer 133 may be formed which contacts the first source dielectric layer 101 by penetrating the preliminary source stacked structure PS. The second source dielectric layer 133 may be formed on the first source dielectric layer 101.

Referring to FIG. 3C, first material layers 141 and second material layers 143 are alternately stacked on the second source seed layer 131 and the second source dielectric layer 133.

The second material layers 143 may be formed of a different material than the first material layers 141. For example, the first material layers 141 may be formed of a dielectric material for interlayer dielectric layers, and the second material layers 143 may be formed of a conductive material for conductive patterns.

Alternatively, the first material layers 141 may be formed of a dielectric material for interlayer dielectric layers, and the second material layers 143 may be formed of a sacrificial dielectric material that is used for sacrificial layers and has a different etching selection ratio than the first material layers 141. In this case, the first material layers 141 may be formed of a silicon oxide layer, and the second material layers 143 may be formed of a silicon nitride layer. When both the first and second material layers 141 and 143 are formed of a dielectric material, it is possible to decrease the degree of difficulty of etching processes for forming channel holes or slits.

Alternatively, the first material layers 141 may be formed of a sacrificial dielectric material that is used for sacrificial layers and has a different etching selection ratio than the second material layers 143, and the second material layers 143 may be formed of a conductive material for conductive patterns. In this case, the first material layers 141 may be formed of an undoped polysilicon layer, and the second material layers 143 may be formed of a doped polysilicon layer. When both the first and second material layers 141 and 143 are formed of a conductive material, it is possible to decrease the difficulty of etching processes for forming channel holes or slits.

Figure 3D:
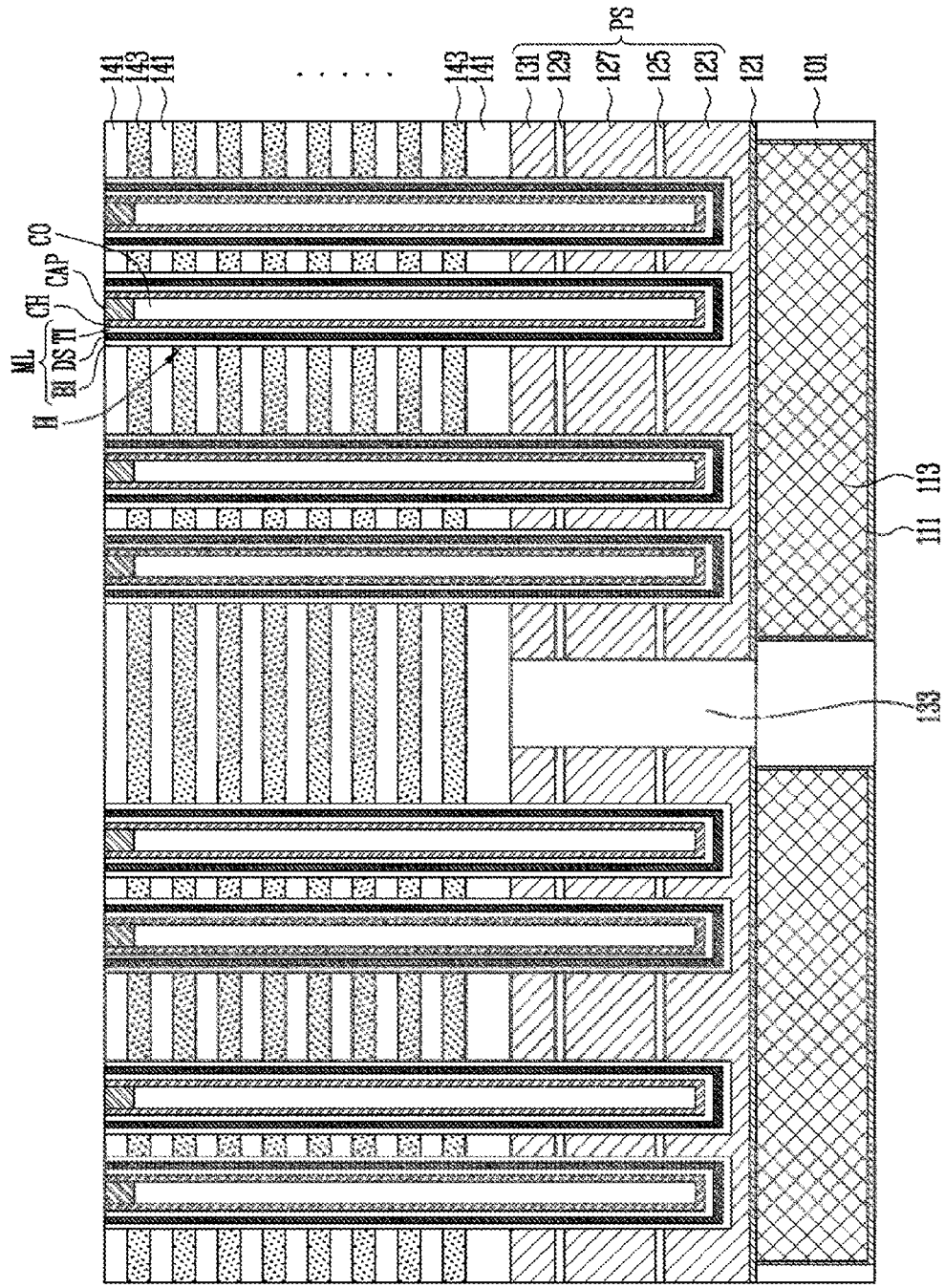

Referring to FIG. 3D, channel holes H are formed so that the channel holes H penetrate the first and second material layers 141 and 143 and the preliminary source stacked structure PS. The channel holes H may extend to completely penetrate the second source seed layer 131, the second protective layer 129, the sacrificial layer 127, and the first protective layer 125 of the preliminary source stacked structure PS. The channel holes H may also penetrate a portion of the first source seed layer 123 of the preliminary source stacked structure PS.

Subsequently, a channel layer CH surrounded by a multi-layered layer ML is formed inside each of the channel holes H. The multi-layered layer ML may be formed by sequentially stacking a blocking insulating layer BI, a data storage layer DS, and a tunnel insulating layer TI. The blocking insulating layer BL, the data storage layer DS, and the tunnel insulating layer TI may be formed on a surface of each of the channel holes H. The data storage layer DS may surround the tunnel insulating layer TI, and the blocking insulating layer BL may surround the data storage layer DS. The tunnel insulating layer TI may surround the channel layer CH, and the channel layer CH may be formed on the tunnel insulating layer TI. Further, the channel layer CH may be formed to extend inside the first source seed layer 123 by penetrating the first material layers 141 and the second material layers 143. The channel layer CH may be formed to completely fill the inside of each of the channel holes H, or may be formed to open a central area of each of the channel holes H. When the central area of each of the channel holes H is opened by the channel layer CH, the central area of each of the channel holes H may be filled with a core insulating layer CO. The core insulating layer CO may be formed lower than a top of each of the channel holes H. In this case, a capping layer CAP may be further formed at the top of the core insulating layer CO to fill in an upper end of each of the channel holes H.

Figure 3E:
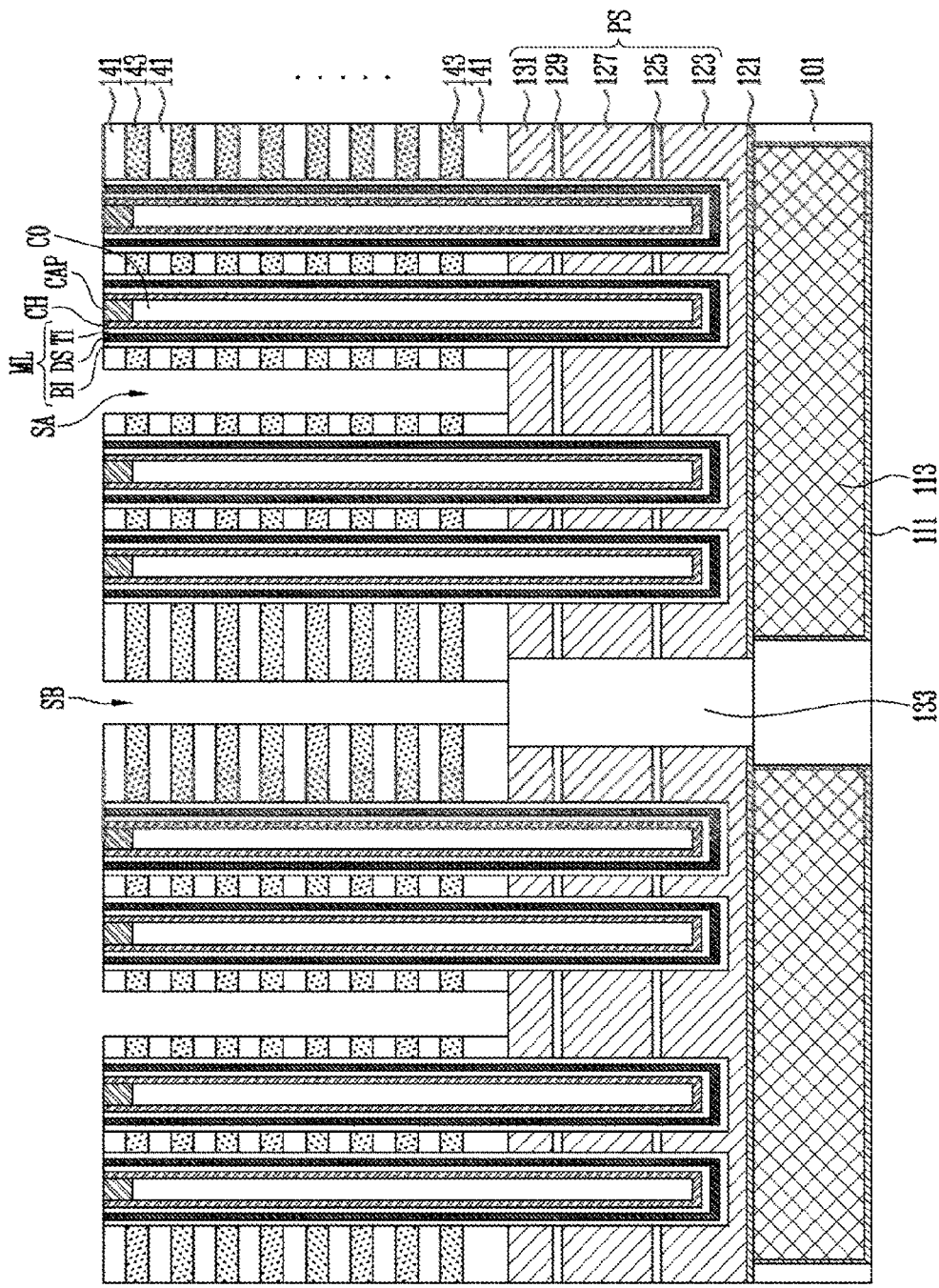

Referring to FIG. 3E, slits SA and SB penetrating the first and second material layers 141 and 143 are formed by etching the first and second material layers 141 and 143. The slits SA and SB may include a first slit SA between the channel layers CH and penetrating the first and second material layers 141 and 143, and a second slit SB overlapping the second source dielectric layer 133 and penetrating the first and second material layers 141 and 143.

When the first material layers 141 are formed of a dielectric material for interlayer dielectric layers and the second material layers 143 are formed of a sacrificial dielectric material, a difference in etching selection ratio between the second source seed layer 131 and the first and second material layers 141 and 143 may be used. More specifically, when an etching process of the first and second material layers 141 and 143 is performed, the second source seed layer 131 may be used as an etch stop layer. Accordingly, the slits SA and SB may be formed to a uniform depth.

Figure 3F:
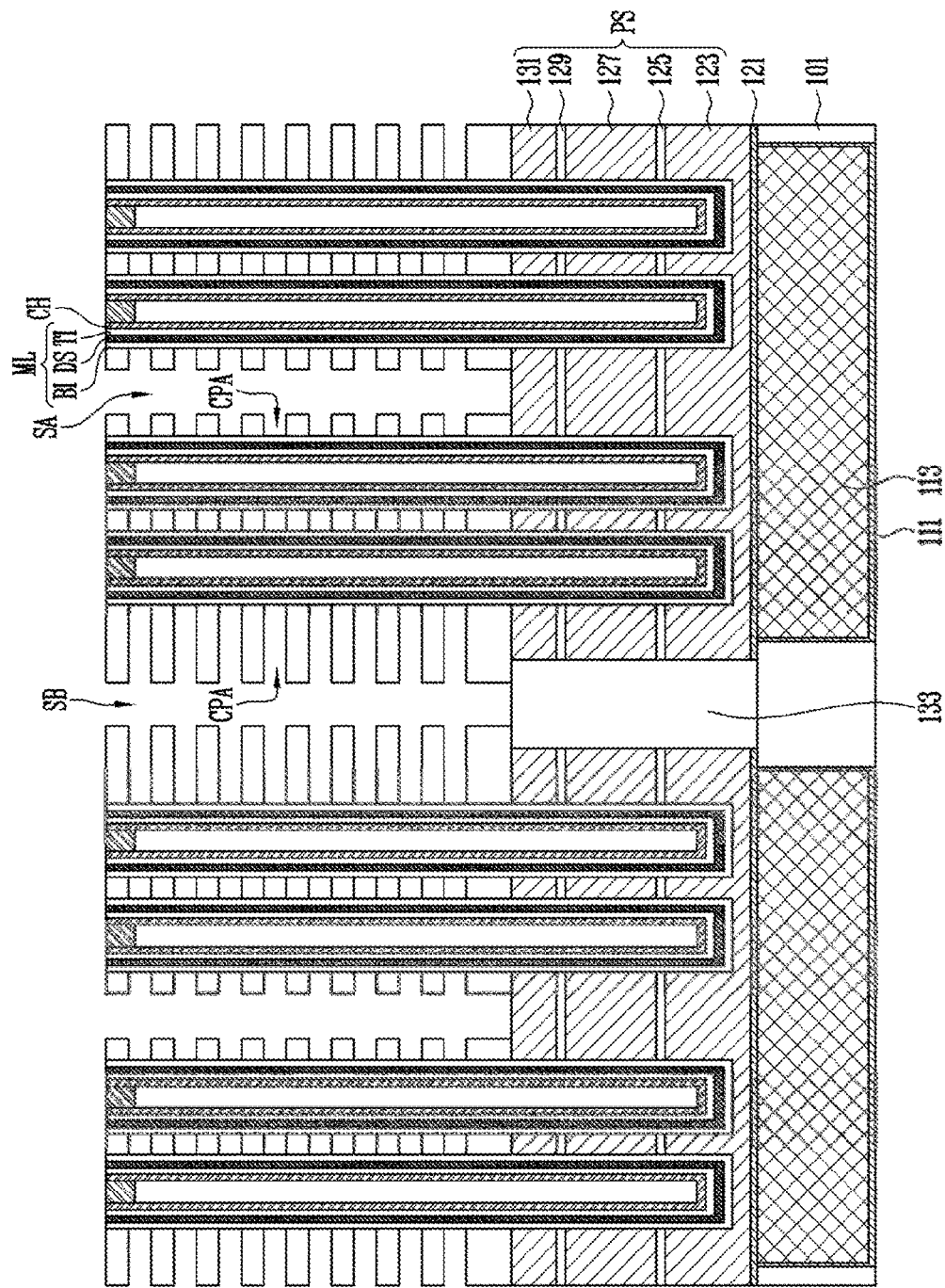
Figure 3G:
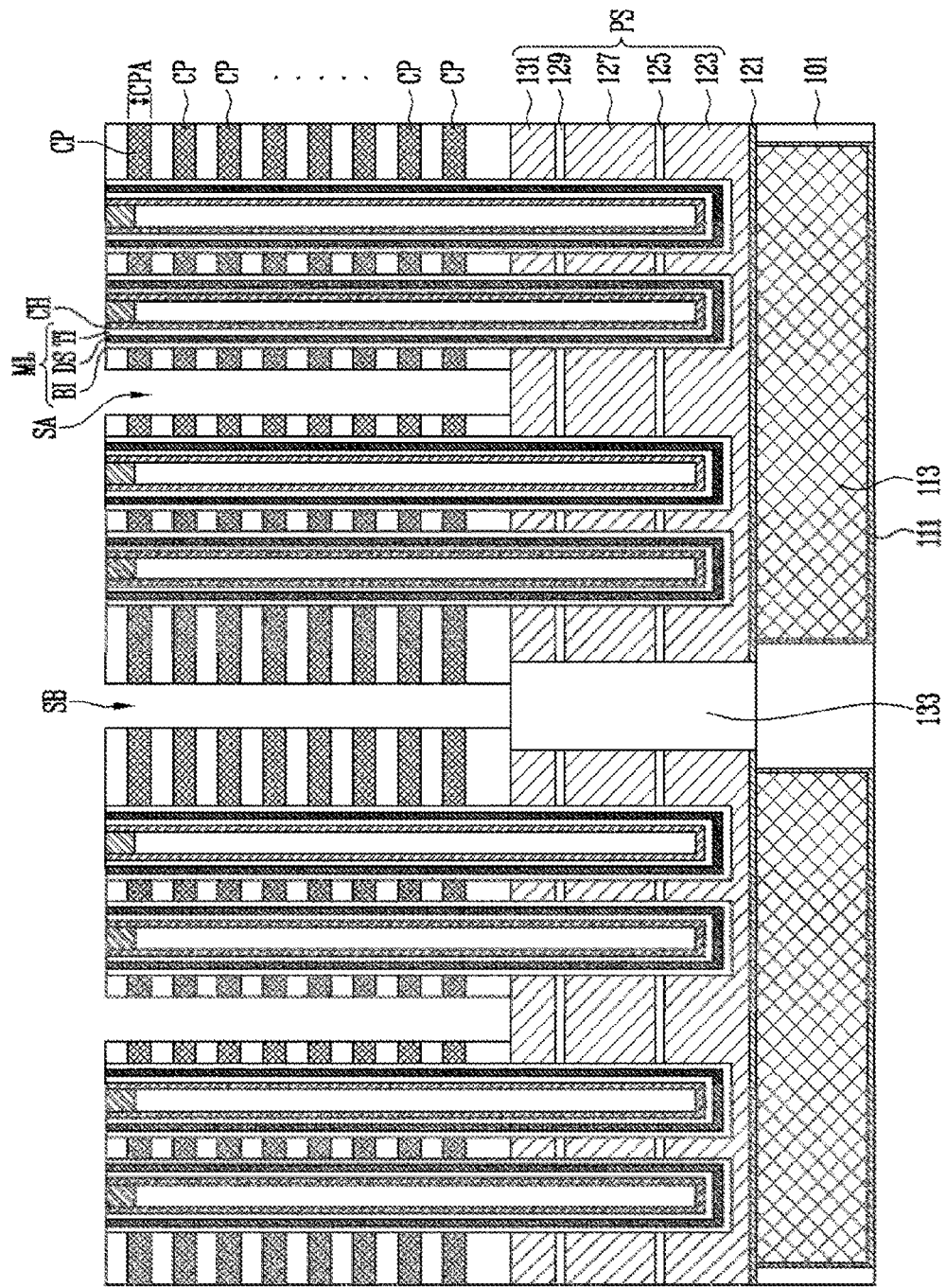

The following FIGS. 3F to 3G illustrate subsequent processes by exemplifying a case where the first material layers 141 are formed of a dielectric material for interlayer dielectric layers and the second material layers 143 are formed of a sacrificial dielectric material.

Referring to FIG. 3F, the second material layers 143 are selectively removed through the slits SA and SB, thereby opening conductive pattern areas CPA. In this state, the channel layers CH are supported by the preliminary source stacked structure PS, and thus the structure of the channel layers CH may be stably maintained.

Referring to FIG. 3G, each of the conductive pattern areas CPA may be filled with a third material layer through the slits SA and SB. The third material layer may be a conductive material. Accordingly, conductive patterns CP are formed inside the conductive pattern areas CPA. Namely, the conductive patterns CP are formed by replacing the the second material layers 143 with third material layers through the slits SA and SB. The conductive patterns CP may include tungsten, etc. Although not shown in this figure, before the conductive patterns CP are formed, at least one of a barrier layer and a blocking insulating layer may be further formed along the surface of each of the conductive pattern areas CPA.

Unlike the case described in FIGS. 3F and 3G, when the first material layers 141 are formed of a dielectric material for interlayer dielectric layers and the second material layers 143 are formed of a conductive material for conductive patterns, the second material layers 143 may be separated into the conductive patterns CP through the slits SA and SB.

Alternatively, when the first material layers 141 are formed of a sacrificial conductive material and the second material layers 143 are formed of a conductive material for conductive patterns, each of the first material layers 141 may be replaced with the third material layer that is a dielectric material, and the second material layers 143 may be separated into the conductive patterns CP through the slits SA and SB.

Referring to FIG. 3H, the first source through-hole SH1 penetrating the second source seed layer 131 is formed by etching the second source seed layer 131 exposed through the first slit SA. In this case, the second protective layer 129 may be used as an etch stop layer by using a difference in etching selection ratio between the second source seed layer 131 and the second protective layer 129. Accordingly, it is possible to prevent irregular loss of the sacrificial layer 127.

After that, before removing the sacrificial layer 127, a sidewall insulating layer 151 having a different etching selection ratio than the sacrificial layer 127 may be formed on sidewalls of the slits SA and SB and the first source through-hole SH1. For example, the sidewall insulating layer 151 may be formed as a single nitride layer, or may be formed into a multi-layered structure including first to third sidewall insulating layers as described in FIG. 2. The sidewall insulating layer 151 may protect the conductive patterns CP and the second source seed layer 131 while a subsequent process of removing the sacrificial layer 127 is performed.

Referring to FIG. 3I, a second source through-hole SH2 is formed by sequentially performing a process of etching the second protective layer 129 exposed through the first source through-hole SH1 and a process of etching the sacrificial layer 127. In this case, as a portion of the second source dielectric layer 133 exposed through the second slit SB is etched, a first groove CA1 may be concavely formed in the second source dielectric layer 133.

The sacrificial layer 127 is exposed through the second source through-hole SH2. In the process of etching the sacrificial layer 127, the first protective layer 125 may be used as an etch stop layer by using a difference in etching selection ratio between the sacrificial layer 127 and the first protective layer 125. Accordingly, it is possible to prevent loss of the first source seed layer 123.

The etching process of forming the second source through-hole SH2 vertically penetrating the sacrificial layer 127 may be omitted when necessary.

Figure 3J:
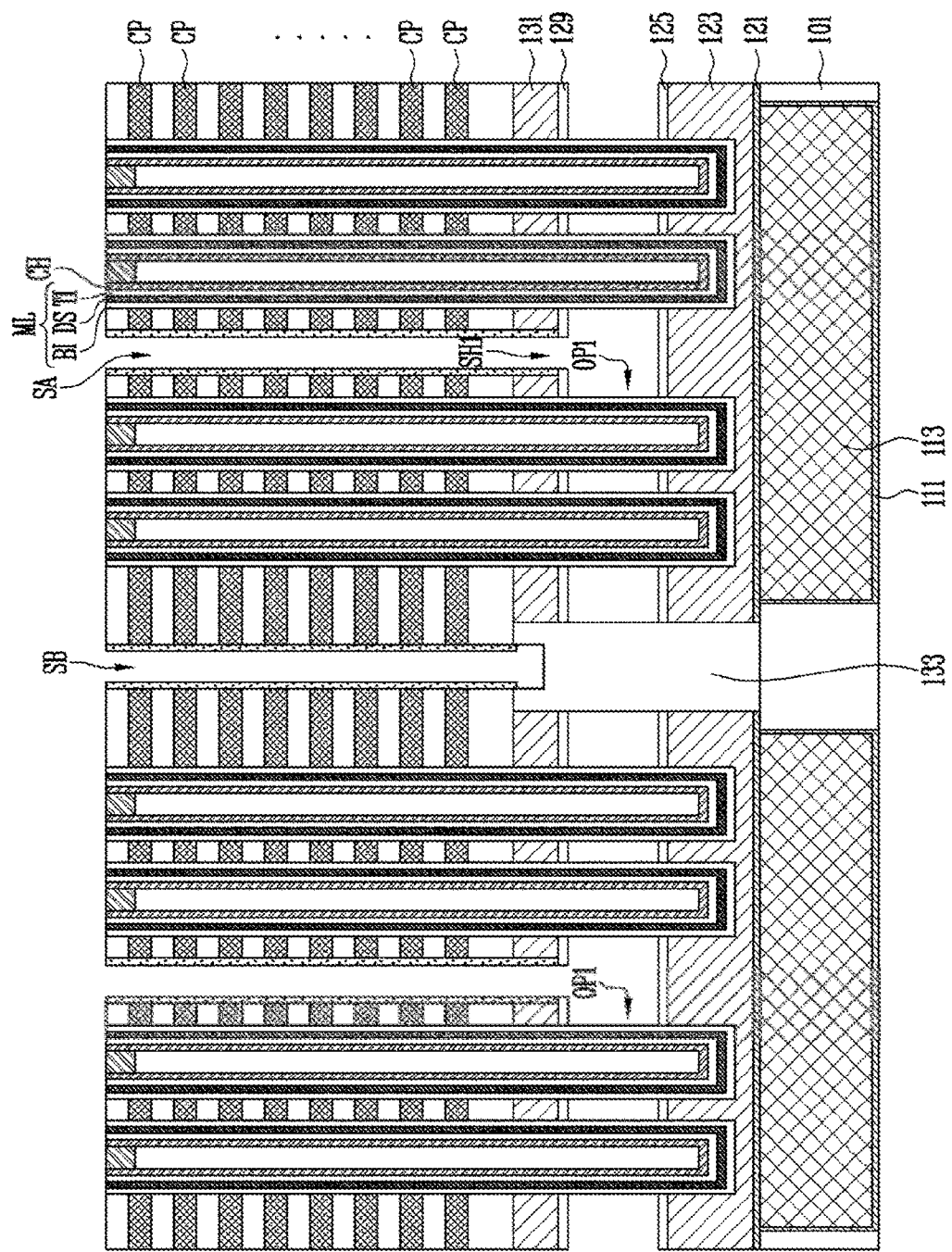

Referring to FIG. 3J, a first opening OP1 is formed between the first and second protective layers 125 and 129 by removing the sacrificial layer 127 exposed through the first and second source through-holes SH1 and SH2. In the process of removing the sacrificial layer 127, the first and second protective layers 125 and 129 may be used as etch stop layers by using a difference in etching selection ratio between the sacrificial layer 127 and the first and second protective layers 125 and 129. Accordingly, it is possible to prevent loss of the first and second source seed layers 123 and 131.

A portion of the multi-layered layer ML may be exposed through the first opening OP1 formed by removing the sacrificial layer 127.

Figure 3K:
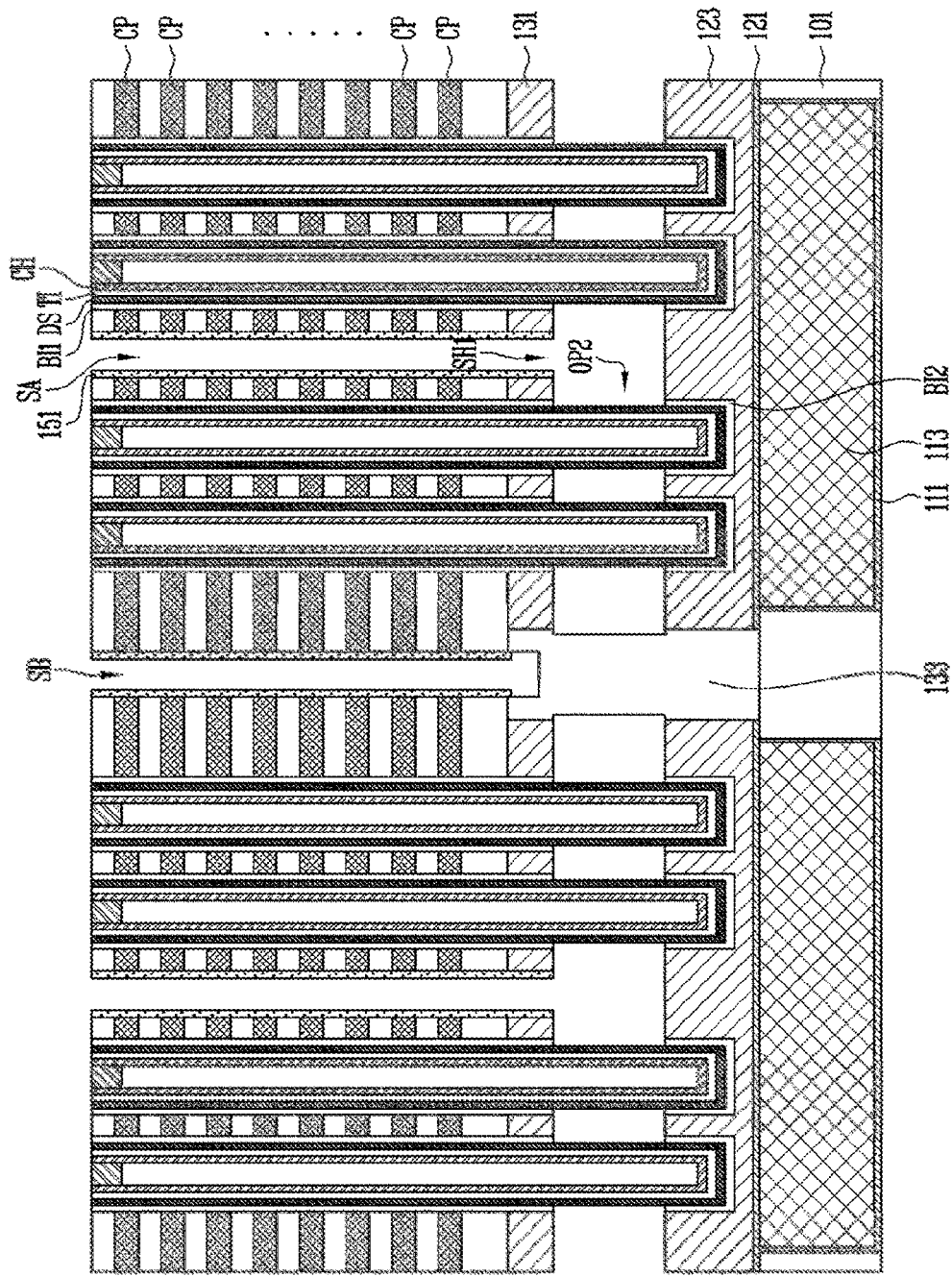

Referring to FIG. 3K, the first and second protective layers 125 and 129 exposed through the first opening groove OP1 are removed. Accordingly, a second opening OP2 is formed. In the process of removing the first and second protective layers 125 and 129, the first and second source seed layers 123 and 131 may be used as etch stop layers by using a difference in etching selection ratio between the first and second protective layers 125 and 129 and the first and second source seed layers 123 and 131. Accordingly, the height of the second opening OP2 may be uniformly controlled as a spacing distance between the first and second source seed layers 123 and 131.

During the etching process of forming the second opening OP2, the blocking insulating layer BI may be etched to be separated into a first blocking insulating pattern BI1 and a second blocking insulating pattern BI2. Accordingly, the data storage layer DS is exposed. The sidewall insulating layer 151 may be formed into a multi-layered structure including the materials described in FIG. 2. Further, the third sidewall insulating layer (SWI3 of FIG. 2) formed at the innermost side of the sidewall insulating layer 151 may be surrounded by the second sidewall insulating layer and may be formed of a material having a high etching selection ratio with respect to the blocking insulating layer BI and the first and second protective layers 125 and 129. For example, the third sidewall insulating layer may be formed of a nitride layer. Accordingly, the third sidewall insulating layer is not removed but remains during the etching process of the blocking insulating layer BI and the first and second protective layers 125 and 129, thereby serving as a protective layer.

Referring to FIG. 3L, the data storage layer DS and the tunnel insulating layer TI are etched through the second opening OP2 to open a source area OPS exposing the channel layers CH between the first and second source seed layers 123 and 131. Accordingly, the data storage layer DS may be separated into a first data storage pattern DS1 and a second data storage pattern DS2 by the source area OPS, and the tunnel insulating layer TI may be separated into a first tunnel insulating pattern TI1 and a second tunnel insulating pattern TI2 by the source area OPS. That is, the multi-layered layer ML may be separated into a first multi-layered pattern ML1 and a second multi-layered pattern ML2 by the source area OPS. When the sidewall insulating layer 151 is formed into the multi-layered structure including the materials described in FIG. 2, the sidewall insulating layer 151 may include first to third sidewall insulating layers. The second sidewall insulating layer surrounded by the first sidewall insulating layer and between the first and third sidewall insulating layers may be formed of a material having a different etching selection ratio with respect to the data storage layer DS, and the first sidewall insulating layer formed at the outermost side of the sidewall insulating layer 151 may be formed of a material having a different etching selection ratio with respect to the tunnel insulating layer TI. For example, the second sidewall insulating layer may be formed of an oxide layer, and the first sidewall insulating layer may be formed of a nitride layer. Accordingly, the second sidewall insulating layer is not removed but remains during the etching process of the data storage layer DS, thereby serving as a protective layer. In addition, the first sidewall insulating layer is not removed but remains during the etching process of the tunnel insulating layer TI, thereby serving as a protective layer.

As described above, the source area OPS may be formed by sequentially performing the process of forming the first opening OP1 by removing the sacrificial layer 127 through the etching process using the difference in etching selection ratio, the process of forming the second opening OP2 by removing the blocking insulating layer BI and the first and second protective layers 125 and 129 through the etching process using the difference in etching selection ratio, and the process of etching the data storage layer DS and the tunnel insulating layer TI. The height of the source area OPS may be uniformly controlled through the processes of forming the first and second openings OP1 and OP2 by using the differences in etching selection ratio. The height of the source area OPS is equal to the spacing distance between the first and second source seed layers 123 and 131.

According to an embodiment of the present disclosure, the loss of the first and second source seed layers 123 and 131 is prevented, so that it is possible to uniformly maintain the spacing distance between the first and second source seed layers 123 and 131.

When the height of the source area OPS, which is defined as the spacing distance between the first and second source seed layers 123 and 131, is uniformly maintained, the channel layers CH by the source area OPS may be exposed with a uniform height.

As a portion of the sidewall of the second source dielectric layer 133 may be etched in the process of removing the first and second protective layers 125 and 129 and the process of etching the data storage layer DS and the tunnel insulating layer TI, a second groove CA2 may be concavely formed in the sidewall of the second source dielectric layer 133.

Figure 3M:
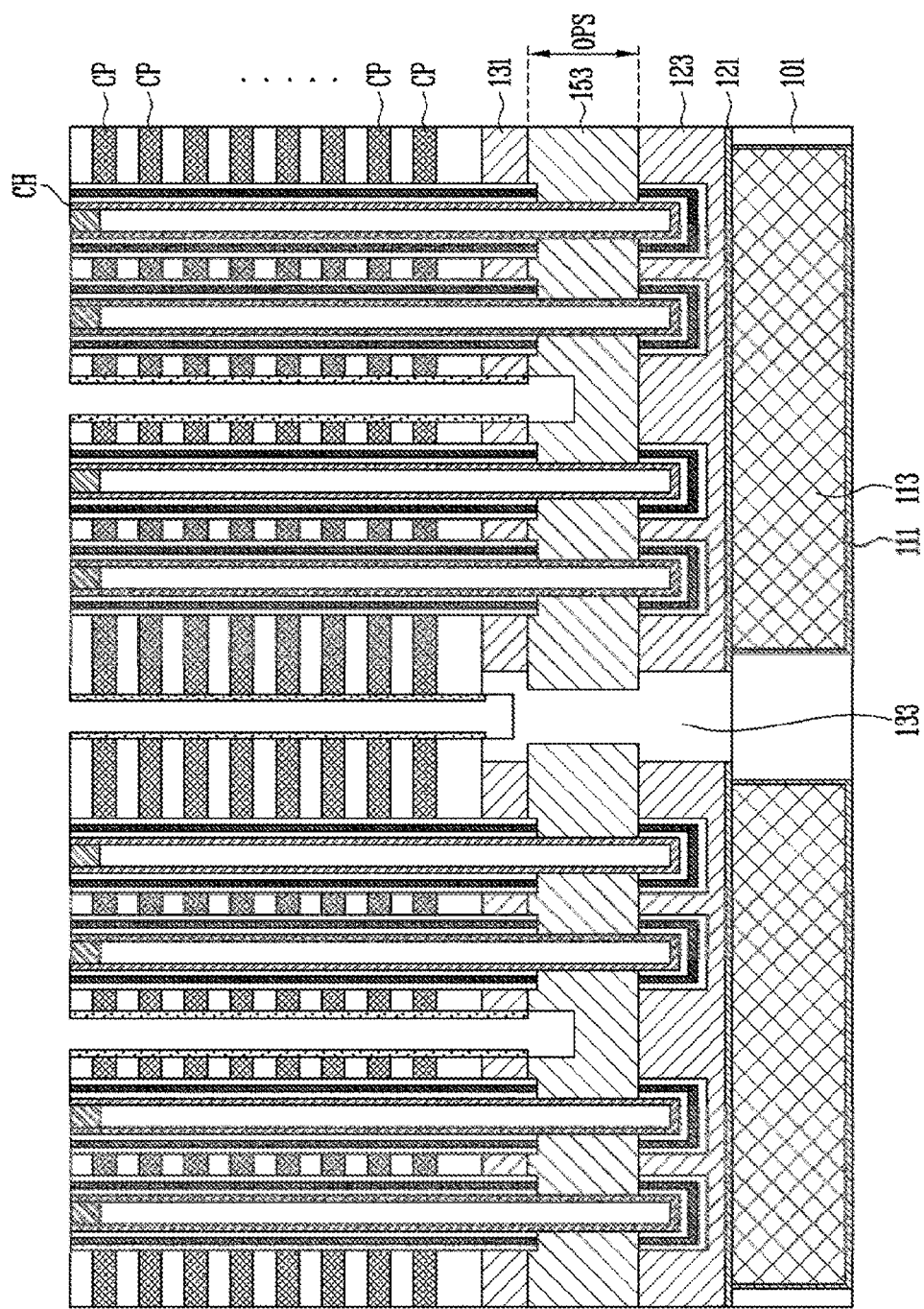

Referring to FIG. 3M, an interlayer source layer 153 is grown from the first source seed layer 123, the second source seed layer 131, and the channel layers CH, which are exposed through the source area OPS. Accordingly, the inside of the source area OPS is filled with the interlayer source layer 153. The heights of the channel layers CH exposed through the source area OPS are uniform to each other, and thus the areas of the interlayer source layer 153 contacted with the channel layers CH may also be uniform.

Subsequently, dopants from the first and second source seed layers 123 and 131 may be diffused into the interlayer source layer 153 through a thermal process. The contact areas between the interlayer source layer 153 and the channel layers CH are uniform to each other, and thus it is possible to uniformly control the diffusion distance of the dopants diffused from the interlayer source layer 153 into the channel layers CH. Accordingly, in an embodiment of the present disclosure, it is possible to uniformly control operational characteristics of a memory string.

Subsequently, the slit insulating layer described in FIG. 1A may be formed.

Figure 4:
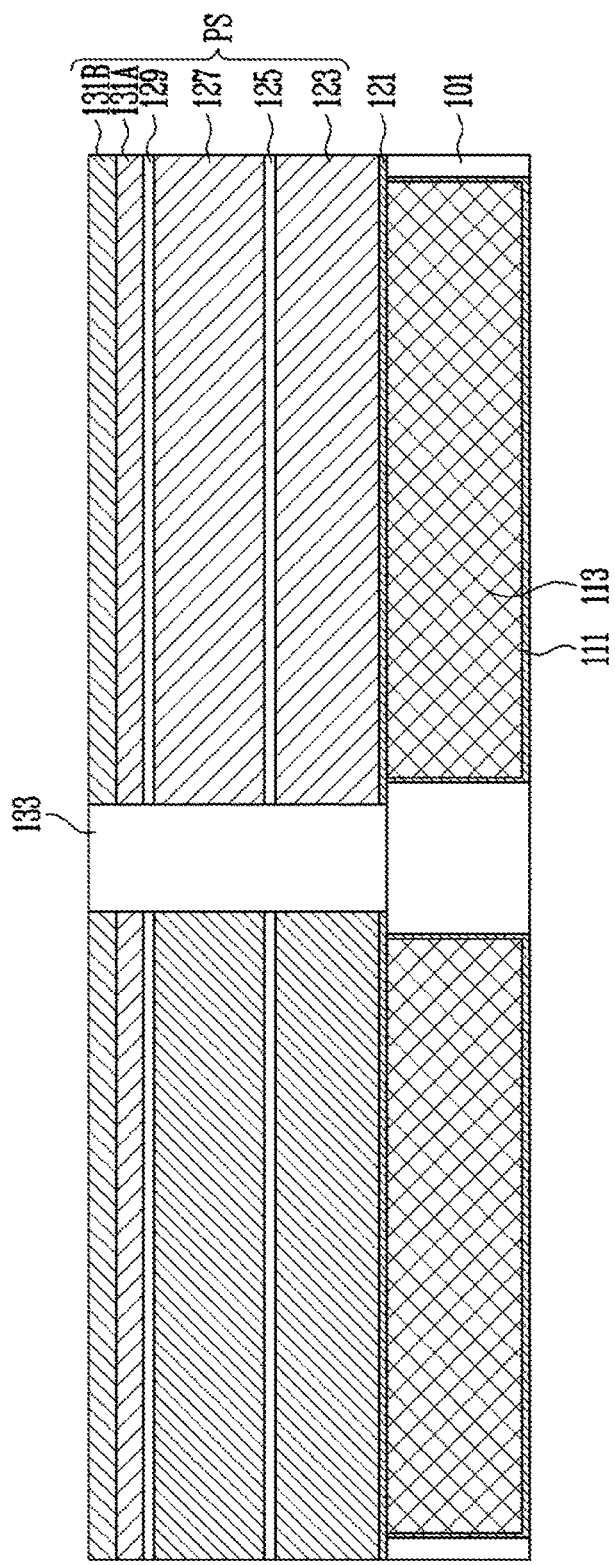
FIG. 4 is a sectional view illustrating a manufacturing method of a semiconductor device according to an embodiment of the present disclosure.

FIG. 4 is a sectional view illustrating a manufacturing method of a semiconductor device according to an embodiment of the present disclosure. More specifically, FIG. 4 is a sectional view illustrating a manufacturing method of the semiconductor device shown in FIG. 1B.

Referring to FIG. 4, a first barrier metal layer 111, a metal source layer 113, and a first source dielectric layer 101, which have the same structure as described in FIG. 3A, are formed by using the same materials and processes as described in FIG. 3A.

Subsequently, a preliminary source stacked structure PS may be formed on the first source dielectric layer 101 including the metal source layer 113. Before the preliminary source stacked structure PS, a second barrier metal layer 121 may be further formed on the first source dielectric layer 101 including the metal source layer 113 so as to prevent metal diffusion from the metal source layer 113.

The preliminary source stacked structure PS may be formed by sequentially stacking a first source seed layer 123, a sacrificial layer 127, a second source seed layer 131A, and an etch stop source layer 131B. The preliminary source stacked structure PS may further include a first protective layer 125 and a second protective layer 129. The properties and structures of the first and second protective layers 125 and 129 are the same as described in FIG. 3B.

The second source seed layer 131A may be formed of the same material as the second source seed layer described in FIG. 3B. The second source seed layer 131A may be formed with a thickness thinner than that of the second source seed layer described in FIG. 3B. The etch stop source layer 131B may be formed on the second source seed layer 131A. The total thickness of the etch stop source layer 131B and the second source seed layer 131A may be thinner than the thickness of the second source seed layer described in FIG. 3B. The etch stop source layer 131B may be formed of a material having a higher etching selection ratio with respect to an oxide layer than the second source seed layer 131A. For example, the etch stop source layer 131B may be formed of carbon doped polysilicon.

Subsequent processes are the same as described in FIGS. 3C to 3M.

In the embodiment shown in FIG. 4, the depths of slits (particularly, SA of FIG. 3E) may be uniformly controlled by using the etch stop source layer 131B during an etching process for forming the slits shown in FIG. 3E.

Figure 5:
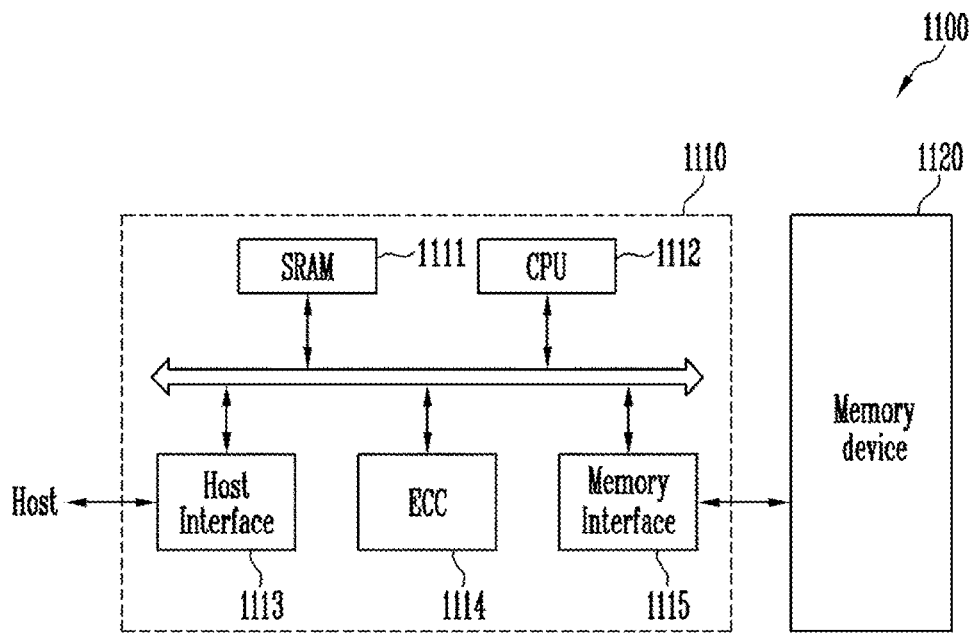
FIG. 5 is a block diagram illustrating a configuration of a memory system according to an embodiment of the present disclosure.

FIG. 5 is a block diagram illustrating a configuration of a memory system according to an embodiment of the present disclosure.

Referring to FIG. 5, the memory system 1100 according to the embodiment of the present disclosure includes a memory device 1120 and a memory controller 1110.

The memory device 1120 may include the structures described in FIGS. 1A, 1B, and 2. For example, the memory device 1120 may include an interlayer source layer disposed in a sandwich structure between a first source seed layer and a second source seed layer. Also, the memory device 1120 may be a multi-chip package formed of a plurality of flash memory chips.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs a general control operation for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1100 may communicate with the outside (e.g., the host) through one among various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 6:
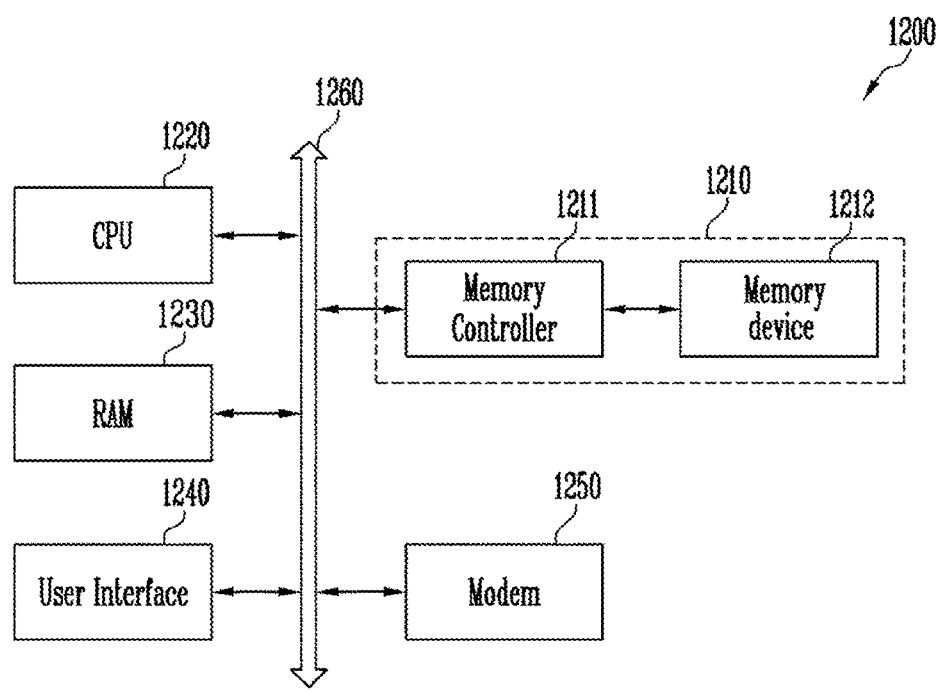
FIG. 6 is a block diagram illustrating a configuration of a computing system according to an embodiment of the present disclosure.

FIG. 6 is a block diagram illustrating a configuration of a computing system according to an embodiment of the present disclosure.

Referring to FIG. 6, the computing system 1200 according to an embodiment of the present disclosure may include a CPU 1220, a random access memory (RAM) 1230, a user interface 1240, a modem 1250, and a memory system 1210, which are electrically connected via a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 5, may be configured with a memory device 1212 and a memory controller 1211.

According to the present disclosure, the multi-layered layer surrounding the channel layer is removed through the source area opened between the first and second source seed layers, so that it is possible to expose the channel layer that becomes a growth seed of the interlayer source layer. Further, the source layer and the channel layer may be electrically connected to each other through the interlayer source layer. This has a low degree of difficulty as compared with a technique of connecting a channel layer and a source layer to each other by removing a portion of a multi-layered layer through a long channel hole. Thus, it is possible to improve the manufacturing yield of the semiconductor.

Also, a process is performed to prevent loss of the first and second source seed layers, and the source area between the first and second source seed layers is filled with the interlayer source layer grown from the first and second source seed layers. Thus, the interlayer source layer may be grown upward and downward. Accordingly, although the growth thickness of the interlayer source layer is reduced, the source area may be completely filled with the interlayer source layer. Further, it is possible to prevent voids from being formed in the source area.

Also, since the growth thickness of the interlayer source layer is reduced, the growth time of the interlayer source layer may be decreased, thereby decreasing a manufacturing time of the semiconductor.

Also, the loss of the first and second source seed layers may be prevented, and the formation of voids in the interlayer source layer may be prevented. Accordingly, it is possible to stably secure electrical characteristics of the source layer including the first and second source seed layers and the interlayer source layer.

Example embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a first source seed layer;
   a second source seed layer disposed over the first source seed layer while being spaced apart from the first source seed layer;
   a stacked structure formed on the second source seed layer;
   channel layers extending inside the first source seed layer by penetrating the stacked structure; and
   an interlayer source layer extending into a space between the first source seed layer and the second source seed layer while directly contacting the channel layers, the first source seed layer, and the second source seed layer.

2. The semiconductor device of claim 1, wherein the first source seed layer, the second source seed layer, and the interlayer source layer include an n-type or p-type dopant.

3. The semiconductor device of claim 1, wherein the first source seed layer, the second source seed layer, and the interlayer source layer include silicon.

4. The semiconductor device of claim 1, further comprising an etch stop source layer formed on the second source seed layer, the etch stop source layer being formed of a material having a higher etching selection ratio with respect to an oxide layer than the second source seed layer.

5. The semiconductor device of claim 4, wherein the etch stop source layer includes carbon doped polysilicon.

6. The semiconductor device of claim 1, wherein the stacked structure includes interlayer dielectric layers and conductive patterns, which are alternately stacked.

7. The semiconductor device of claim 1, further comprising:
   a slit penetrating the stacked structure and the second source seed layer between the channel layers;
   a sidewall insulating layer formed on a sidewall of the slit; and
   a slit insulating layer filling in the slit, the slit insulating layer being formed on the sidewall insulating layer, the slit insulating layer extending to an upper portion of the interlayer source layer.

8. The semiconductor device of claim 7, wherein the sidewall insulating layer is formed as a single layer of a nitride layer.

9. The semiconductor device of claim 7, wherein the sidewall insulating layer includes:
   a first sidewall insulating layer including a nitride layer;
   a second sidewall insulating layer surrounded by the first sidewall insulating layer, the second sidewall insulating layer including an oxide layer; and
   a third sidewall insulating layer surrounded by the second sidewall insulating layer, the third sidewall insulating layer including a nitride layer.

10. The semiconductor device of claim 1, comprising:
    a first multi-layered pattern surrounding the outer wall of a first portion of each of the channel layers, which penetrates the stacked structure and the second source seed layer; and
    a second multi-layered pattern surrounding the outer wall of a second portion of each of the channel layers, which penetrates an upper portion of the first source seed layer.

11. The semiconductor device of claim 10, wherein the first multi-layered pattern and the second multi-layered pattern are separated by the interlayer source layer.

12. The semiconductor device of claim 10, wherein each of the first multi-layered pattern and the second multi-layered pattern includes:
    a tunnel insulating layer surrounding the outer wall of each of the channel layers;
    a data storage layer surrounding the tunnel insulating layer; and
    a blocking insulating layer surrounding the data storage layer.

13. The semiconductor device of claim 1, further comprising a metal source layer disposed under the first source seed layer, the metal source layer being formed of a material having a lower resistance than the first source seed layer and the second source seed layer.

14. The semiconductor device of claim 13, further comprising:
    a first barrier metal layer surrounding the sidewall and bottom surface of the metal source layer; and
    a second barrier metal layer disposed between the first source seed layer and the metal source layer.

15. The semiconductor device of claim 1, wherein the interlayer source layer surrounds a portion of each of the channel layers, the portion disposed between the first source seed layer and the second source seed layer.

* * * * *